(12) United States Patent
Mizutani

(10) Patent No.: US 12,727,445 B2
(45) Date of Patent: Sep. 1, 2026

(54) PROCESSING METHOD OF WAFER

(71) Applicant: DISCO CORPORATION, Tokyo (JP)

(72) Inventor: Akira Mizutani, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 300 days.

(21) Appl. No.: 18/748,630

(22) Filed: Jun. 20, 2024

(65) Prior Publication Data

US 2025/0006484 A1 Jan. 2, 2025

(30) Foreign Application Priority Data

Jun. 28, 2023 (JP) ................................ 2023-105914

(51) Int. Cl.
*H10P 90/00* (2026.01)

(52) U.S. Cl.
CPC .......... *H10P 90/128* (2026.01); *H10P 90/123* (2026.01); *H10P 90/124* (2026.01)

(58) Field of Classification Search
CPC ....... B24B 7/228; B24B 37/005; B24B 37/04; B24B 37/042; B24B 37/10; B24B 37/105
See application file for complete search history.

(56) References Cited

FOREIGN PATENT DOCUMENTS

| | | | | |
|---|---|---|---|---|
| CN | 1545723 A | * 11/2004 | .............. | H10P 74/00 |
| JP | 2020088187 A | 6/2020 | | |
| TW | 202044402 A | * 12/2020 | .......... | H10P 72/0418 |
| WO | WO-03107402 A1 | * 12/2003 | .............. | H10P 74/00 |

* cited by examiner

*Primary Examiner* — Joel D Crandall
(74) *Attorney, Agent, or Firm* — GREER BURNS & CRAIN, LTD.

(57) ABSTRACT

A processing method of a wafer includes a modified layer forming step of irradiating the wafer, from its back surface, with a laser beam of a wavelength having transmissivity for the wafer with its focal point positioned inside a boundary portion between an effective area and a chamfered portion, whereby a modified layer is formed along the chamfered portion, a chamfered portion removing step of applying an external force to an outer periphery of the wafer, and grinding the back surface of the wafer to a desired wafer thickness. The modified layer forming step includes a first step of forming a first modified layer relatively deep with cracks formed extending to the front surface, and a second step of forming a second modified layer relatively shallow, adjacent and on an outer or inner side of the first modified layer, with cracks formed not extending to the front surface.

5 Claims, 5 Drawing Sheets

32
32b
10A
102, 104, 106
34
36b
36c
17A
36a
T
101
100, 102, 104, 106
L+P
36

32
32b
10A
10Ac
T 10A
16A
10Ab
T
10Ac

PROCESSING METHOD OF WAFER

BACKGROUND OF THE INVENTION

Field of the Invention

The present invention relates to a processing method of a wafer having an effective area and a chamfered portion formed at an outer periphery thereof and surrounding the effective area.

Description of the Related Art

A wafer having on a front surface thereof a device region, in which a plurality of devices such as integrated circuits (ICs) or large-scale integrations (LSIs) are formed and defined by a plurality of intersecting scribe lines, is ground and processed at a back surface thereof to a desired thickness, and is then divided into individual device chips by a cutting apparatus or a laser processing apparatus. The divided device chips are used in electronic equipment such as mobile phones or personal computers.

A chamfered portion is formed at an outer periphery of the wafer. When the wafer is thinned by being ground at its back surface, the chamfered portion is sharpened like a knife edge, leading to a problem that an operator may be injured or cracks may extend from the outer periphery of the wafer and may damage the devices.

A technique has therefore been proposed by the present assignee to remove a chamfered portion at an outer periphery of a wafer when performing grinding processing on the wafer (see Japanese Patent Laid-open No. 2020-088187). In this technique, before being ground at a back surface thereof, the wafer is irradiated with a laser beam of a wavelength, which has transmissivity for the wafer, with a focal point thereof positioned on an inner side of the chamfered portion such that a modified layer is formed in a ring shape inside the wafer.

SUMMARY OF THE INVENTION

According to the technique described in Japanese Patent Laid-open No. 2020-088187, the chamfered portion is removed by an external force applied during the grinding processing. However, the chamfered portion may not be completely removed from the outer periphery of the wafer and may remain a little. A problem hence arises such that a remaining part falls off as a contaminant source in a post-step or causes chipping of individual device chips when dividing the wafer into the individual device chips.

With a view to completely removing a chamfered portion from an outer periphery of a wafer, the present invention therefore has as an object thereof the provision of a processing method of the wafer, which can solve the problem that a remaining part of the chamfered portion falls off as a contaminant source in a post-step or causes chipping of individual device chips when dividing the wafer into the individual device chips, and reduces the quality of the device chips.

In accordance with an aspect of the present invention, there is provided a processing method of a wafer having an effective area formed on a front surface thereof and a chamfered portion formed at an outer periphery thereof and surrounding the effective area. The processing method includes a modified layer forming step of irradiating the wafer, from a back surface thereof, with a laser beam of a wavelength having transmissivity for the wafer with a focal point of the laser beam positioned inside a boundary portion between the effective area and the chamfered portion, whereby a modified layer is formed along the chamfered portion, a chamfered portion removing step of, after performing the modified layer forming step, applying an external force to the outer periphery of the wafer to remove the chamfered portion, and a processing step of grinding the back surface of the wafer to process the wafer to a desired thickness. The modified layer forming step includes a first step of irradiating the wafer with the laser beam with the focal point of the laser beam positioned inside the boundary portion between the effective area and the chamfered portion such that a first modified layer is formed relatively deep, with cracks formed extending to the front surface of the wafer, and a second step of irradiating the wafer with the laser beam with the focal point of the laser beam positioned inside the boundary portion between the effective area and the chamfered portion such that a second modified layer is formed relatively shallow, adjacent and on an outer or inner side of the first modified layer, with cracks formed not extending to the front surface of the wafer, and the chamfered portion is bent, from a side of the front surface toward a side of the back surface, with the first modified layer as a start point.

Preferably, the external force is applied to the outer periphery of the wafer by any one of high-pressure air, high-pressure water, a mixed fluid of high-pressure air and high-pressure water, or a picker. Preferably, the chamfered portion removing step is performed by an external force applied by action of grinding when the back surface of the wafer is ground in the processing step. Preferably, the wafer is a bonded wafer in which a first wafer and a second wafer are bonded together, and the modified layer forming step, the chamfered portion removing step, and the processing step are performed on the first wafer. Preferably, in the second step, the second modified layer is formed at a position where the second modified layer is to be ground and removed in the processing step.

The processing method of the present invention for the wafer is configured to bend the chamfered portion, from the side of the front surface toward the side of the back surface, with the first modified layer as the start point. The chamfered portion can therefore be effectively removed from the outer periphery of the wafer, thereby solving the problem that the chamfered portion remains in parts on an outer peripheral end of the wafer, and the remaining part of the chamfered portion falls off as a contaminant source in a post-step or causes chipping of individual device chips when dividing the wafer into the individual device chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the attached drawings, a description will be made in detail regarding a processing method according to an embodiment of the present invention for a wafer.

Figure 1A:
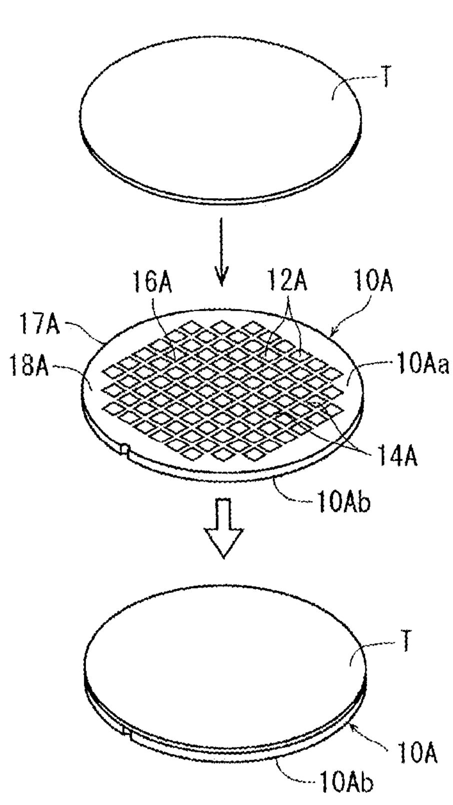
FIG. 1A is a perspective view of a single wafer as a workpiece to which a processing method according to an embodiment of the present invention can be applied.

In FIG. 1A, a single wafer 10A that is to be processed by the processing method of this embodiment is depicted along with a protective tape T that is to be bonded to the wafer 10A. The depicted wafer 10A is, for example, a single silicon wafer of 300 mm in diameter and 300 μm in thickness, and on a front surface 10Aa, a plurality of devices 12A are formed and defined by a plurality of intersecting scribe lines 14A. The wafer 10A has the front surface 10Aa and a back surface 10Ab, and includes a central effective area 16A where the devices 12A to be used as products are formed, a chamfered portion 17A formed at an outer peripheral end portion surrounding the effective area 16A, and a boundary portion 18A located between the effective area 16A and the chamfered portion 17A and formed with no devices 12A to be used as products. When processed by the processing method of this embodiment, the wafer 10A and the protective tape T are integrated by bonding the protective tape T to a side of the front surface 10Aa as depicted in the figure.

Figure 1B:
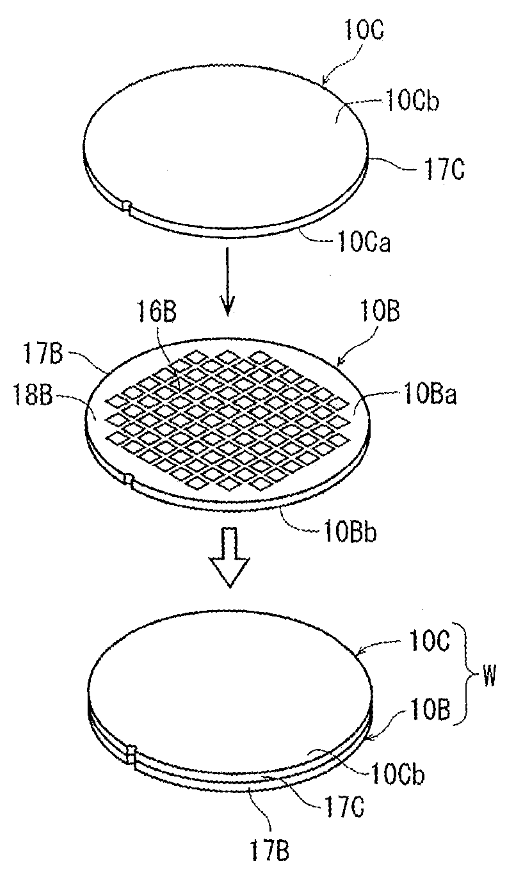
FIG. 1B is a perspective view of a bonded wafer as another workpiece to which the processing method according to the embodiment can be applied.

In FIG. 1B, another wafer that is to be processed by the processing method of this embodiment, specifically a bonded wafer W, is depicted. The bonded wafer W is a wafer integrated by bonding a first wafer 10B and a second wafer 10C. The first wafer 10B is, for example, a silicon wafer having the same configuration as the above-described wafer 10A, including a front surface 10Ba and a back surface 10Bb, and having a diameter of 300 mm and a thickness of 300 μm. On the front surface 10Ba, a plurality of devices 12B are formed and defined by a plurality of intersecting scribe lines 14B. The first wafer 10B includes a central effective area 16B where the devices 12B to be used as products are formed, a chamfered portion 17B formed at an outer peripheral end portion surrounding the effective area 16B, and a boundary portion 18B located between the effective area 16B and the chamfered portion 17B and formed with no devices 12B to be used as products. The second wafer 10C is also a silicon wafer having a similar configuration as the first wafer 10B, and having a plurality of devices formed on a front surface 10Ca directed downward in the figure and defined by a plurality of intersecting scribe lines although neither the scribe lines nor the devices are depicted in the figure. The first wafer 10B and the second wafer 10C are integrated together, for example, through siloxane bonds by bonding the front surface 10Ba of the first wafer 10B and the front surface 10Ca of the second wafer 10C with each other and subjecting them to heat treatment.

It is to be noted that wafers processable by the processing method of the below-described embodiment are not limited to the above-described single silicon wafer 10A and bonded wafer W formed by bonding two silicon wafers together, and include a variety of wafers having an effective area and a chamfered portion formed at an outer peripheral end portion surrounding the effective area. Examples may include wafers of gallium nitride (GaN), wafers of gallium arsenide (GaAs), wafers of lithium tantalate ($LiTaO_3$), and wafers of lithium niobate ($LiNbO_3$), and may further include wafers central areas of which do not have devices formed thereon but will be processed later for use as products (for example, glass wafers). In the embodiment which will be described hereinafter, the processing method of this embodiment will be described taking, as an example, the above-described wafer 10A or the bonded wafer W that is a stacked wafer.

Modified Layer Forming Step

When the processing method of this embodiment is performed on the wafer 10A, a modified layer forming step is first performed to form modified layers along the chamfered portion 17A by irradiating the wafer 10A, from the back surface 10Ab thereof, with a laser beam of a wavelength having transmissivity for the wafer 10A with a focal point of the laser beam positioned inside the boundary portion 18A between the effective area 16A and the chamfered portion 17A.

Figure 2A:
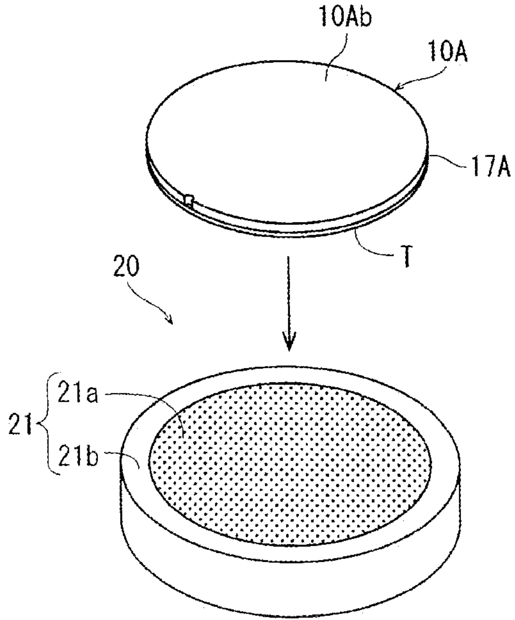
FIG. 2A is a perspective view depicting how the single wafer is placed on a chuck table in a modified layer forming step of the processing method according to the embodiment.
Figure 2B:
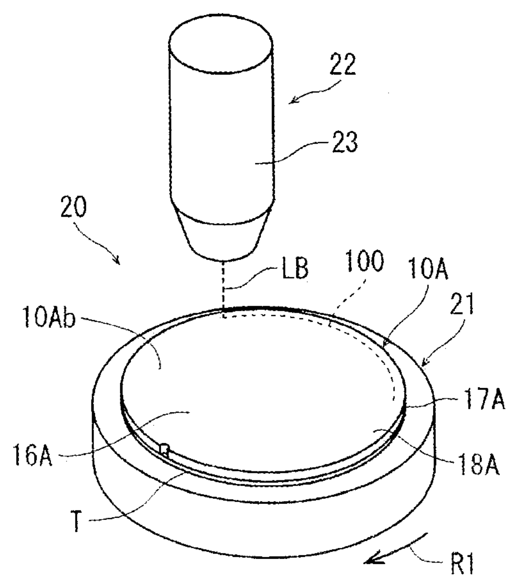
FIG. 2B is a perspective view depicting how a modified layer is formed in the modified layer forming step.

In the modified layer forming step, the above-described wafer 10A is first transferred into a laser processing apparatus 20 depicted in FIGS. 2A and 2B (only parts of which are depicted). The laser processing apparatus 20 includes at least a chuck table 21 depicted in FIG. 2A and a laser beam irradiation unit 22 depicted in FIG. 2B. The chuck table 21 includes a suction chuck 21*a* formed by a member that has air permeability and makes up a suction surface on a side of an upper surface and a frame body 21*b* surrounding the suction chuck 21*a*. The laser beam irradiation unit 22 includes a laser oscillator (not depicted) that emits the laser beam of the wavelength having transmissivity for silicon as a constituent of the wafer 10A and a condenser 23 that condenses the laser beam emitted from the laser oscillator and irradiates a condensed laser beam LB. The laser processing apparatus 20 also includes a moving mechanism for moving the chuck table 21, a rotary drive mechanism for rotating the chuck table 21, suction means for generating a negative pressure over the upper surface of the suction chuck 21*a*, and the like (all not depicted).

After the wafer 10A has been transferred into the laser processing apparatus 20, the wafer 10A is placed on the chuck table 21 with a side of the protective tape T directed downward and a side of the back surface 10Ab directed upward as depicted in FIG. 2A, and the suction means (not depicted) is operated to hold the wafer 10A by suction. On the wafer 10A held by suction on the chuck table 21, alignment is performed with use of an alignment unit and a height detector (both not depicted) arranged on the laser processing apparatus 20, thereby detecting the position of the outer peripheral end portion, at which the chamfered portion 17A is formed, of the wafer 10A and a central position of the wafer 10A, and also detecting the height of the back surface 10Ab of the wafer 10A, and hence detecting a processing position to be irradiated with the laser beam LB in the above-described boundary portion 18A.

The modified layer forming step to be performed in this embodiment includes at least a first step and a second step, which will hereinafter be described.

First Step

By detecting the position of the outer peripheral end portion of the wafer 10A, at which the chamfered portion 17A is formed, and the central position of the wafer 10A, a position, for example, with a radius of 147 mm from the central position of the wafer 10A, the position that is located, for example, on an inner side of a region where the chamfered portion 17A is formed from the outer peripheral end portion of the wafer 10A (for example, a region of 0.5 mm from the outer peripheral end portion) and that is set in a ring shape corresponding to the above-described boundary portion 18A, is detected as a predetermined processing position where, in the first step, laser processing is applied to form a first modified layer. Position information of the processing position detected as described above is stored in an undepicted controller.

Figure 3A:
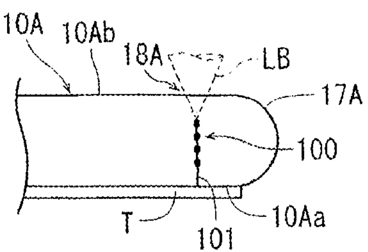
FIG. 3A is a schematic fragmentary cross-sectional view depicting the arrangement of a first modified layer in the modified layer forming step.

Based on the information on the processing position for the first step detected by the above-descried alignment, the chuck table 21 is moved to position the condenser 23 of the laser beam irradiation unit 22 above the above-described predetermined processing position, as depicted in FIG. 2B. Next, the wafer 10A is irradiated, from the side of the back surface 10Ab thereof, with the laser beam LB with the focal point of the laser beam LB positioned inside the boundary portion 18A, and at the same time the chuck table 21 is rotated in a direction indicated by arrow R1, whereby a first modified layer 100 is formed over an entire circumference along the chamfered portion 17A of the wafer 10A. In this first step, the first modified layer 100 is formed at such a relatively deep level that, as depicted in FIG. 3A, cracks 101 attributable to the formation of the first modified layer 100 are formed extending to the side of the front surface 10Aa of the wafer 10A. Preferably, this first modified layer 100 is formed in a plurality of layers at different depths in an up-down direction. The first modified layer 100 depicted in FIG. 3A includes, for example, four modified layers formed at different depths in the up-down direction. When this first modified layer 100 is to be formed, the laser beam LB is first applied to the wafer 10A, with its focal point positioned at a level set at a deepest portion inside the boundary portion 18A (for example, at a depth of 180 μm from the back surface Ab) of the wafer 10A, and at the same time the chuck table 21 is rotated as described above, whereby a ring-shaped modified layer is formed in a first layer along the chamfered portion 17A. After that, with the chuck table 21 kept rotating, the focal point is raised three times toward the side of the back surface 10Ab (upward) such that the depth from the back surface 10Ab is changed, for example, in an order of 170 μm, 160 μm, and 150 μm, whereby the ring-shaped modified layers are formed in four layers in total along the chamfered portion 17A, and at the same time the cracks 101 are caused to occur, extending to the side of the front surface 10Aa of the wafer 10A. The first step is now completed.

Second Step

Figure 3B:
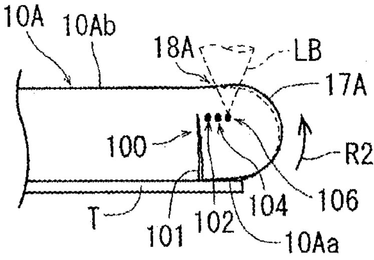
FIG. 3B is a schematic fragmentary cross-sectional view depicting the arrangement of a second modified layer in the modified layer forming step.

After the first modified layer 100 has been formed through the first step as described above, the second step is performed to form a second modified layer on an outer side or inner side of the first modified layer 100 and at such a level close to the back surface 10Ab of the wafer 10A that, even if cracks are formed, these cracks are relatively shallow and do not extend to the front surface 10Aa of the wafer 10A. Described more specifically, the laser beam LB is applied to the wafer 10A, for example, with its focal point positioned at a point on an outer side of and adjacent the uppermost modified layer (at the depth of 150 μm from the back surface 10Ab) in the first modified layer 100 as depicted in FIG. 3B, and at the same time the chuck table 21 is rotated, whereby a ring-shaped modified layer 102 is formed. The second modified layer to be formed through the second step is preferably formed by a plurality of modified layers as depicted in FIG. 3B. In this embodiment, the laser beam LB is applied to the wafer 10A, with its focal point sequentially positioned at points, which are radially spaced apart from each other, on an outer side of and adjacent the ring-shaped modified layer 102 while the chuck table 21 is kept rotating, so that ring-shaped modified layers 104 and 106 are formed in addition to the above-described ring-shaped modified layer 102. The depth, at which the second modified layer including the multiple modified layers 102, 104, and 106 is formed as described above, is shallower than the depth of the first modified layer 100, and is set at a level where the second modified layer is removed when the wafer 10A is ground and processed at the back surface 10Ab to a desired thickness in the subsequent processing step. Now, the second step is finished, and therefore the modified layer forming step is completed.

By forming the first modified layer 100 and also the cracks 101, which extend to the side of the front surface 10Aa of the wafer 10, through the above-described first step, and further, by forming the second modified layers 102, 104, and 106 through the second step as described above, a stress is applied to the first modified layer 100. As a consequence, as depicted in FIG. 3B, the cracks 101 further extend in the up-down direction along the first modified layer 100, so that the chamfered portion 17A can be bent in a direction indicated by arrow R2 in the figure, in other words, toward the side of the back surface 10Ab, with the first modified layer 100 as a start point.

When the above-described modified layer forming step is performed, laser processing conditions are set, for example, as follows.

Figure 3C:
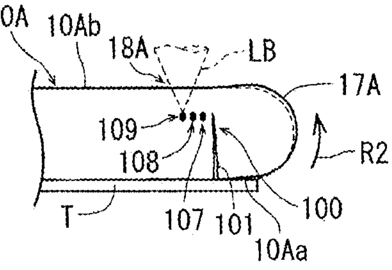
FIG. 3C is a schematic fragmentary cross-sectional view depicting the arrangement of another second modified layer in the modified layer forming step.

Wavelength: 1,099 nm
Repetition frequency: 80 KHz
Average power output: 2.0 W
Processing feed rate: 450 mm/s
or
Wavelength: 1,342 nm
Repetition frequency: 90 KHz
Average power output: 1.9 W
Processing feed rate: 400 mm/s The second modified layer formed through the second step, which is performed in the modified layer forming step in this embodiment, is not limited to the arrangement depicted in FIG. 3B. As depicted in FIG. 3C, for example, the second modified layer (modified layers 107, 108, and 109) may be formed by applying the laser beam LB to the wafer 10A, with its focal point sequentially positioned at relatively shallow points adjacent and on an inner side of the above-described first modified layer 100 (on a side of the effective area) in the boundary portion 18A such that, if cracks are formed, they do not extend to the front surface 10Aa of the wafer 10A. The second modified layer (modified layers 107, 108, and 109) depicted in FIG. 3C can also apply a stress to the first modified layer 100 like the second modified layer (modified layers 102, 104, and 106) depicted in FIG. 3B, can make the cracks 101 extend in the up-down direction along the first modified layer 100, and with the first modified layer 100 as a start point, can bend the chamfered portion 17A in the direction indicated by arrow R2 in the figure, in other words, toward the side of the back surface 10Ab. The second modified layer (modified layers 107, 108, and 109) in this arrangement is also set at a depth position where it is removed when the wafer 10A is ground and processed at the back surface 10Ab to a desired thickness in the subsequent processing step.

It is to be noted that, also when the modified layer forming step based on this embodiment is performed on the bonded wafer W formed by bonding the first wafer 10B and the second wafer 10C together, the above-described first step and second step are performed to form the first modified layer and second modified layer described based on FIGS. 3A to 3C. When the modified layer forming step is performed on the bonded wafer W, the modified layer forming step is performed following the same procedures as the above-described procedures of forming the modified layers in the wafer 10A except that the bonded wafer W is held by suction on the chuck table 21 of the laser processing apparatus 20 with the back surface 10Bb of the first wafer 10B directed upward, and therefore its detailed description is omitted. In the following description, the description will be continued assuming that the first modified layer 100 and the second modified layer (modified layers 102, 104, and 106) described based on FIGS. 3A and 3B have been formed in the wafer 10A or the first wafer 10B of the bonded wafer W through the above-described modification layer forming step.

On an outer periphery of each wafer in which the first modified layer and the second modified layer have been formed through the above-described modified layer forming step, a chamfered portion removing step is performed to remove the chamfered portion by applying an external force.

Figures 4A, 4B:
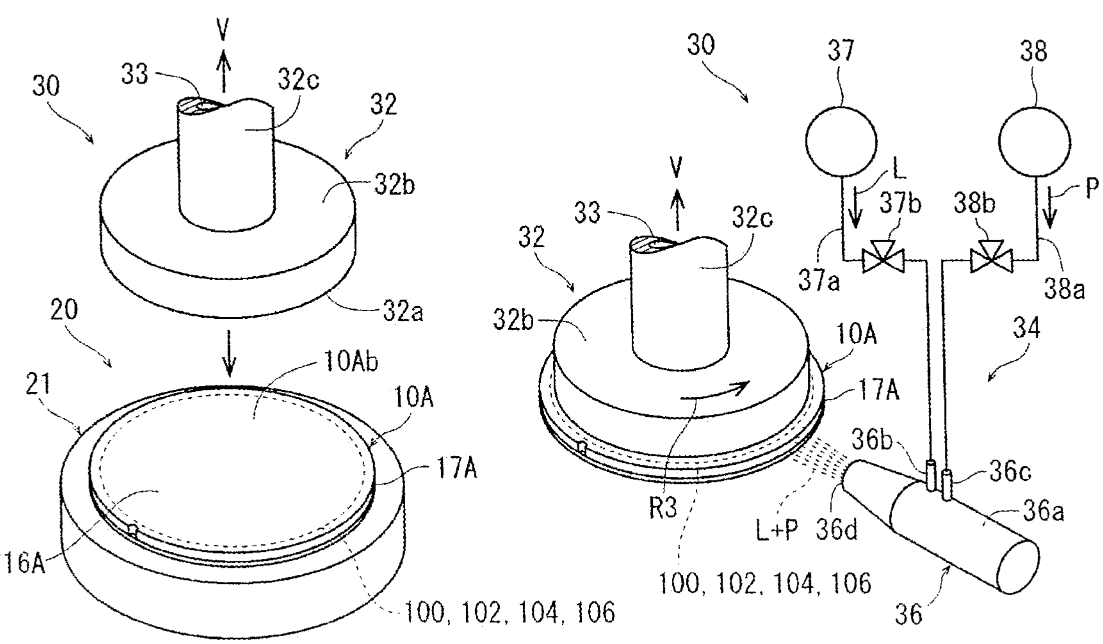
FIG. 4A is a perspective view depicting how the single wafer is held by a holding unit in a chamfered portion removing step of the processing method according to the embodiment.
FIG. 4B is a perspective view depicting the configuration of a fluid ejection unit in the chamfered portion removing step.

In FIGS. 4A and 4B, a chamfered portion remover 30 suited for performing the chamfered portion removing step on the wafer 10A, to which the modified layer forming step has been applied, is depicted (only parts of the chamfered portion remover 30 are depicted). The chamfered portion remover 30 in this embodiment includes a holding unit 32 that holds the effective area 16A of the wafer 10A and a fluid ejection unit 34 arranged as chamfered portion removing means for removing the chamfered portion 17A from the effective area 16A of the wafer 10A. The holding unit 32 includes a disk-shaped suction portion 32*b* with a holding surface 32*a* included on a side of a lower surface and a support shaft 32*c* connected to a center of the suction portion 32*b* and including a rotary drive mechanism (not depicted). The holding surface 32*a* is constituted by a member having air permeability, a communication channel 33 is formed in the support shaft 32*c* to connect suction means (not depicted) and the holding surface 32*a*, and a negative pressure V is generated over the holding surface 32*a* through the communication channel 33. The suction portion 32*b* is formed with plan dimensions, which are smaller than those of the wafer 10A and are equivalent to those of the effective area 16A of the wafer 10A.

The fluid ejection unit 34 depicted in FIG. 4B is means for removing the chamfered portion 17A by applying an external force with fluid to the outer periphery of the wafer 10A that is held at the effective area 16A by the above-described holding unit 32 and extends outward from the holding surface 32*a*. The fluid ejection unit 34 includes a fluid ejection nozzle 36, a water source 37 that supplies high-pressure water L to the fluid ejection nozzle 36, and an air supply source 38 that supplies high-pressure air P to the fluid ejection nozzle 36. The fluid ejection nozzle 36 is a dual-fluid nozzle, the water source 37 is connected to a high-pressure water inlet port 36*b*, which is formed in a nozzle main body 36*a* of the fluid ejection nozzle 36, through a communication path 37*a* including a flow rate control valve 37*b*, and the air supply source 38 is connected to a high-pressure air inlet port 36*c*, which is formed in the nozzle main body 36*a*, through a communication path 38*a* including a flow rate control valve 38*b*. The high-pressure water L introduced from the above-described high-pressure water inlet port 36*b* into the nozzle main body 36*a* and the high-pressure air P introduced from the high-pressure air inlet port 36*c* into the nozzle main body 36*a* are mixed inside the nozzle main body 36*a*, and the resulting mixed fluid L+P of the high-pressure water L and the high-pressure air P is ejected from ejection orifices 36*d*.

In this embodiment, an example is depicted in which the chamfered portion remover 30 is juxtaposed with the above-descried laser processing apparatus 20. When the chamfered portion removing step is performed, the holding unit 32, as depicted in FIG. 4A, is hence positioned above the chuck table 21 of the laser processing apparatus 20, and is lowered. The holding surface 32*a* of the holding unit 32 is then brought into contact with a region, which corresponds to the effective area 16A, on the back surface 10Ab of the wafer 10A, and the suction means (not depicted) is operated to suck the wafer 10A. The negative pressure which has been generated in the chuck table 21 is then released, and the wafer 10A is held on a side of the holding unit 32 of the chamfered portion remover 30. The moving mechanism (not depicted) is next operated to move the holding unit 32, and as depicted in FIG. 4B, the chamfered portion 17A formed at the outer periphery of the wafer 10A is positioned in a vicinity of the ejection orifices 36*d* of the fluid ejection nozzle 36 of the above-described fluid ejection unit 34.

Figures 5A, 5B, 5C, 6:
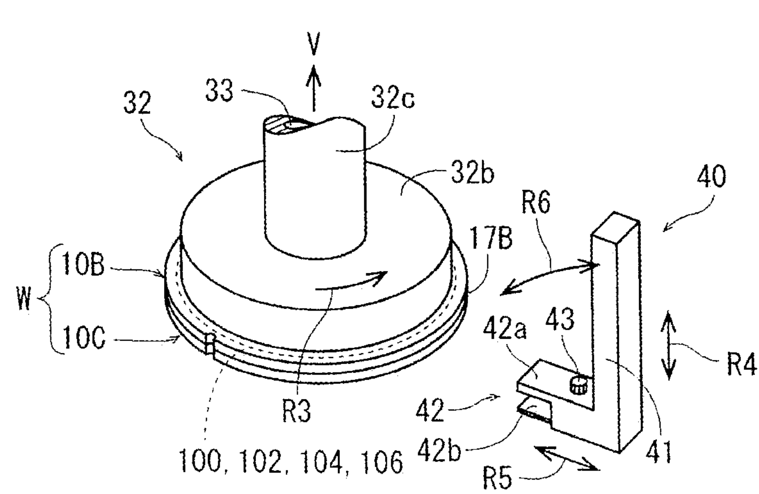
FIG. 5A is a fragmentary side view depicting how fluid is ejected against an outer periphery of the single wafer by the fluid ejection unit.
FIG. 5B is a fragmentary side view depicting, on an enlarged scale, the single wafer held by the holding unit after the chamfered portion has been removed from an outer peripheral end by the fluid ejection unit.
FIG. 5C is an overall perspective view of the single wafer from which the chamfered portion has been removed from the outer peripheral end by the fluid ejection unit.
FIG. 6 is a perspective view depicting an overall configuration of a picker arranged in place of the fluid ejection unit.

Next, the above-described flow rate control valves 37*b* and 38*b* are opened to introduce the high-pressure water L (for example, of 0.3 MPa) and the high-pressure air P (for example, of 0.6 MPa) from the water source 37 and air supply source 38 into the fluid ejection nozzle 36, and as depicted in FIG. 5A, the mixed fluid L+P is ejected from the ejection orifices 36*d* toward the outer periphery at which the chamfered portion 17A of the wafer 10A is formed. It is to be noted that, in this embodiment, the ejection orifices 36*d* of the fluid ejection nozzle 36 are positioned a little lower than the back surface 10Ab of the wafer 10A, and are set such that the mixed fluid L+P is ejected in a direction a little upward with respect to a horizontal direction. As a consequence, an external force is applied by the mixed fluid L+P against the chamfered portion 17A at the outer periphery of the wafer 10A, and the mixed fluid L+P also acts so as to separate the protective tape T and the outer periphery of the wafer 10A from each other, whereby the chamfered portion 17A is ruptured along the first modified layer 100, and as depicted in FIG. 5B, the chamfered portion 17A is removed from an outer peripheral end 10Ac of the wafer 10A. It is to be noted that the rupture takes place in a region, to which the above-described mixed fluid L+P is ejected, and its neighborhood, at this time.

While the mixed fluid L+P is being ejected from the fluid ejection nozzle 36 toward the outer periphery of the wafer 10A as described above, the holding unit 32 is then rotated in a direction indicted by arrow R3 in FIG. 4B, whereby the chamfered portion 17A is removed over the entirety of the outer periphery of the wafer 10A as depicted in FIG. 5C. The chamfered portion removing step has now been performed appropriately. It is to be noted that, as the above-described chamfering portion remover 30 includes a closed space for performing the chamfered portion removing step and the chamfered portion removing step is performed with the wafer 10A and the fluid ejection unit 34 positioned in the closed space, the high-pressure water L ejected from the fluid ejection unit 34 and fragments of the chamfered portion 17A scattered from the outer periphery of the wafer 10A can be efficiently recovered.

In this embodiment, the chamfered portion 17A is bent from the side of the front surface 10Aa toward the side of the back surface 10Ab, with the first modified layer 100 as a start point, by forming the second modified layer (modified layers 102, 104, and 106) in addition to the first modified layer 100, as depicted in FIG. 3B. As a consequence, the chamfered portion 17A can be efficiently removed by the action of the mixed fluid L+P ejected from the ejection orifices 36*d* of the fluid ejection nozzle 36, thereby solving the problem that the chamfered portion 17A remains in parts on the outer peripheral end 10Ac. Further, in the case that the chamfered portion 17A is bent from the side of the front surface 10Aa toward the side of the back surface 10Ab, with the first modified layer 100 as a start point, by forming the above-described second modified layer (modified layers 107, 108, and 109) as depicted in FIG. 3C, the chamfered portion 17A can be efficiently removed from the wafer 10A by the above-described chamfered portion remover 30, thereby also solving the problem that the chamfered portion 17A remains in parts on the outer peripheral end 10Ac.

In the embodiment described above, the external force to be applied to the outer periphery of the wafer 10A is configured to be applied by the mixed fluid L+P, the mixture of the high-pressure air P and high-pressure water L, from the fluid ejection nozzle 36 of the fluid ejection unit 34. The present invention is however not limited to the use of such a mixed fluid. For example, the high-pressure air P alone can be ejected to provide an external force for removing the chamfered portion 17A, or the high-pressure water L alone can be ejected to provide an external force for removing the chamfered portion 17A. In such an alternative, the above-described fluid ejection nozzle 36 that can eject two types of fluid as described above is not needed, and a fluid ejection nozzle that ejects a single fluid can suffice the need.

In addition, the chamfered portion removing means in the present invention is not limited to the chamfered portion removing means that uses one or more types of fluid as an external force, and may be one using a picker 40 that is depicted in FIGS. 6 and 7 and is arranged as another chamfered portion removing means in place of the above-described fluid ejection unit 34.

As depicted in FIG. 6, the picker 40 includes a main body portion 41 extending in the up-down direction and an external force applying portion 42 formed on a lower end portion of the main body portion 41. The external force applying portion 42 includes a stationary plate 42*a*, a movable plate 42*b* configured to be adjustable in interval to the stationary plat 42*a*, and an interval adjusting portion 43 having a threaded structure that moves the movable plate 42*b* to adjust the interval between the stationary plate 42*a* and the movable plate 42*b*. The picker 40 is supported on the chamfered portion remover 30 via a moving mechanism (not depicted), and is configured to be movable up and down in directions indicated by arrows R4, and also to be movable in directions (horizontal directions), which are indicated by arrows R5 in the figure, relative to the holding unit 32. In addition, the picker 40 can also tilt its external force applying portion 42 by tilting the main body portion 41 in a direction which is indicated by arrow R6 in the figure and in which the holding unit 32 is positioned.

The above-described picker 40 is suited when removing the chamfered portion 17 of the first wafer 10B in the bonded wafer W described based on FIG. 1B. In the following description, assuming that the above-described modified layer forming step has been applied to the bonded wafer W and the above-described first modified layer 100 and second modified layer (modified layers 102, 104, and 106) have been formed along the chamfered portion 17B inside the boundary portion 18B between the effective area 16B and the chamfered portion 17B in the first wafer 10B of the bonded wafer W, the description will hence be made regarding a mode in which the chamfered portion removing step is performed with use of the above-described picker 40.

When the chamfered portion removing step is performed on the bonded wafer W, similar procedures as those described based on FIG. 4A are followed. Described specifically, the effective area 16B of the first wafer 10B that constitutes the bonded wafer W is held by the holding unit 32, and the moving mechanism (not depicted) is operated to position the chamfered portion 17B of the first wafer 10B, which constitutes the bonded wafer W, in a vicinity of the external force applying portion 42 of the picker 40, as depicted in FIGS. 6 and 7A.

Figure 7A:
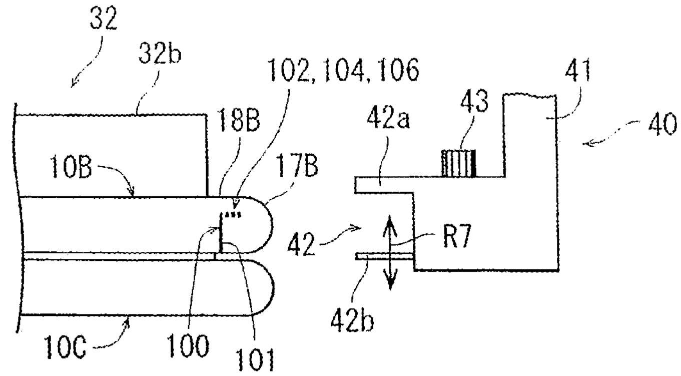
FIG. 7A is a fragmentary side view depicting how a movable plate of the picker depicted in FIG. 6 is operated relative to the bonded wafer of FIG. 1B held by the holding unit.
Figure 7B:
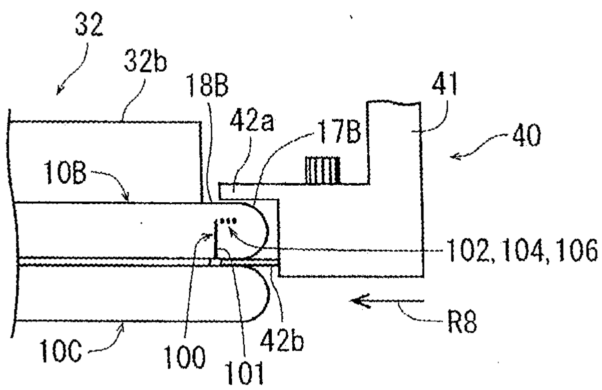
FIG. 7B is a fragmentary side view depicting how the movable plate, which is depicted in FIG. 7A, of the picker is inserted into a bonding interface of the bonded wafer.

Next, by rotating the above-described interval adjusting portion 43, the movable plate 42*b* depicted in FIG. 7A is adjusted in one of directions, which are indicated by arrows R7, so that the interval between the stationary plate 42*a* and the movable plate 42*b* is adjusted to an interval capable of accommodating the thickness of the outer periphery of the first wafer 10B, and at the same time the movable plate 42*b* is positioned at the height of a bonding interface where the first wafer 10B and the second wafer 10C are bonded together. As depicted in FIG. 7B, the picker 40 is moved in a direction indicated by arrow R8 by operating one of the moving mechanisms (not depicted), whereby the movable plate 42*b* is inserted into the bonding interface where the first wafer 10B and the second wafer 10C are bonded together.

Figure 7C:
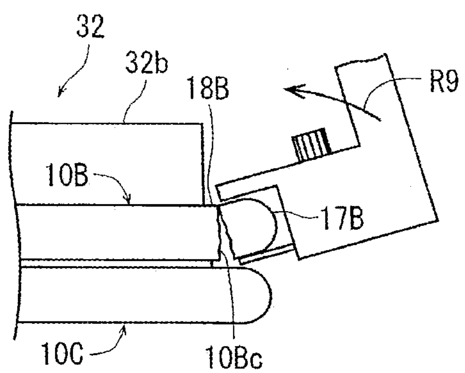
FIG. 7C is a fragmentary side view depicting how the chamfered portion is removed from the bonded wafer by tilting the picker depicted in FIG. 7B.

After the movable plate 42*b* has been inserted as described above, the main body portion 41 is tilted in a direction indicated by arrow R9 as depicted in FIG. 7C. As a consequence, the movable plate 42*b* acts on the chamfered portion 17B of the first wafer 10B to rupture the chamfered portion 17B along the modified layer 100 formed in the above-described boundary portion 18B, so that the chamfered portion 17B can be removed from the outer peripheral end 10Bc of the first wafer 10B. It is to be noted that this rupture takes place only in a region where the movable plate 42*b* is inserted and its neighborhood, and therefore the picker 40 is once separated from the first wafer 10B, and the main body portion 41 is returned to vertical into a state depicted in FIG. 7A.

Figure 7D:
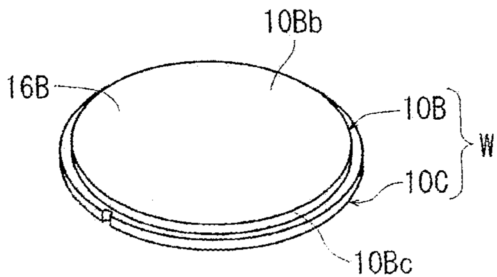
FIG. 7D is a perspective view of the bonded wafer from which a chamfered portion of a first wafer has been removed by the picker.

In the meantime, fragments formed by the above-described rupture of the chamfered portion 17B fall off from the picker 40. The holding unit 32 is next rotated over a predetermined angle in the direction indicated by arrow R3 in FIG. 6 to position the outer peripheral end portion, on which the chamfered portion 17B remains in parts, in a vicinity of the external force applying portion 42 of the picker 40. The above-described operations depicted in FIGS. 7B and 7C are then performed again to remove the remaining part of the chamfered portion 17B from the outer periphery. By repeating these operations a plurality of times, the bonded wafer W is obtained, as depicted in FIG. 7D, with the chamfered portion 17B removed from an outer peripheral end 16Bc of the above-described first wafer 10B over the entirety of the outer periphery of the first wafer 10B. The chamfered portion removing step is now completed.

Even if the chamfered portion removing step is performed as described above, the second modified layer (modified layers 102, 104, and 106) is also formed in addition to the first modified layer 100 in the first wafer 10B, and as depicted in FIG. 7C, the chamfered portion 17B is also bent from a side of the front surface 10Ba toward a side of the back surface 10Bb with the first modified layer 100 as a start point. The chamfered portion 17B can therefore be efficiently removed, thereby solving the problem that the chamfered portion 17B remains in parts on the outer peripheral end 10Bc.

It is to be noted that, in the above-described embodiment, two examples are described, one being to remove the chamfered portion 17A of the single wafer 10A with use of the fluid ejection unit 34 that ejects the two types of fluid as the mixed fluid, the other being to remove the chamfered portion 17B of the first wafer 10B in the bonded wafer W, which has been formed by bonding the first wafer 10B and the second wafer 10C together, with use of the picker 40. However, the present invention is not limited these examples. It is also possible, for example, to remove the chamfered portion 17B of the first wafer 10B in the bonded wafer W as a stacked wafer with use of the above-described fluid ejection unit 34, and to remove the chamfered portion 17A of the single wafer 10A with use of the picker 40.

Figure 8:
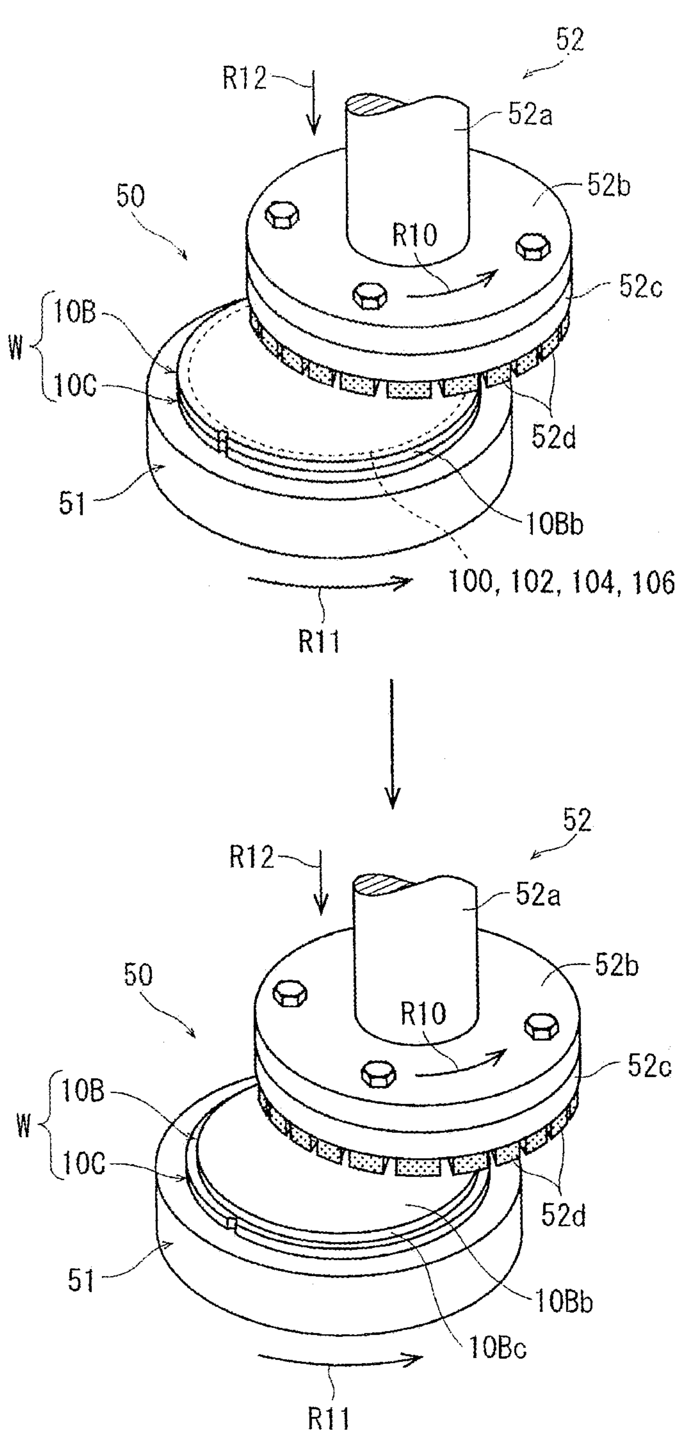
FIG. 8 is a perspective view depicting how a processing step, which also serves as the chamfered portion removing step in the processing method according to this embodiment, is performed.

After the above-described chamfered portion removing step has been completed, it is possible to transfer the wafer, from which the chamfered portion has been removed, to a grinding apparatus 50 depicted in FIG. 8, and to perform the processing step to grind and process the wafer at the back surface to a desired thickness. In this case, the wafer to be processed is the wafer to which the chamfered portion removing step has been applied. In the present invention, however, it is not limited to using, as an object of processing in the processing step, the wafer available after the application of the above-described chamfered portion removing step. For example, on the bonded wafer W to which the above-described modified layer forming step has been applied, the below-descried processing step, which also serves as a chamfered portion removing step, can be also performed without performing the above-described chamfered portion removing step.

In the following description, the description will be made regarding a mode in which the bonded wafer W including the first wafer 10B, in which the first modified layer 100 and the second modified layer (modified layers 102, 104, and 106) have been formed through the above-described modified layer forming step, is ground and processed at the back surface 10Bb to a desired thickness, and in addition, the processing step, which also serves as the chamfered portion removing step, is also performed.

The bonded wafer W, in which the first modified layer 100 and the second modified layer (modified layers 102, 104, and 106) have been formed by the application of the modified layer forming step (on which the chamfered portion removing step has not been performed), is transferred into the grinding apparatus 50 depicted (only in parts) above in FIG. 8. As depicted in the figure, the grinding apparatus 50 includes a grinding unit 52 for grinding the back surface 10Bb of the first wafer 10B of the bonded wafer W, which is held by suction on a chuck table 51, to thin the first wafer 10B. The grinding unit 52 includes a rotating spindle 52*a* that is rotated by a rotary drive mechanism (not depicted), a wheel mount 52*b* that is secured to a lower end of the rotating spindle 52*a*, and a grinding wheel 52*c* that is attached to a lower surface of the wheel mount 52*b*. On a lower surface of the grinding wheel 52*c*, a plurality of grinding stones 52*d* are arranged in an annular pattern.

After the bonded wafer W has been transferred into the grinding apparatus 50, placed on the chuck table 51 with a side of the second wafer 10C directed downward, and held by suction by operating suction means (not depicted), the chuck table 51, as depicted on an upper part of FIG. 8, is rotated, for example, at 300 rpm in a direction indicated by arrow R11 while the rotating spindle 52*a* of the grinding unit 52 is rotated, for example, at 6,000 rpm in a direction indicated by arrow R10 in the figure. While grinding water is supplied onto the back surface 10Bb of the first wafer 10B by grinding water supplying means (not depicted), the grinding stones 52*d* are then brought into contact with the back surface 10Bb of the first wafer 10B, and the grinding wheel 52*c* is fed for grinding downward as indicated by arrow R12 in the figure, for example, at a grinding feed rate of 1 μm/s.

Here, it is possible to proceed with the grinding while measuring the thickness of the bonded wafer W with an undepicted contact or contactless measuring gauge. As the first modified layer 100 and the second modified layer (modified layers 102, 104, and 106) have been formed in the first wafer 10B as described above, an external force is applied to the chamfered portion 17B of the first wafer 10B by the application of the above-descried grinding processing, and as depicted on a lower part of FIG. 8, the chamfered portion 17B of the first wafer 10B is removed from the outer peripheral end 10Bc of the first wafer 10B. After the back surface 10Bb of the first wafer 10B has been ground by a predetermined extent to thin the bonded wafer W to a predetermined thickness in this manner, the grinding unit 52 is stopped, and the processing step is completed.

According to the above-described processing method of the wafer, the chamfered portion is configured to be bent toward the side of the back surface with the first modified layer as a start point by forming the relatively deep first modified layer, from which cracks extend to the front surface of the wafer, and the relatively shallow second modified layer, from which cracks do not extend to the front surface, adjacent and on the radially inner or outer side of the first modified layer. This enables effective removal of the chamfered portion from the outer periphery of the wafer, thereby solving the problem that the chamfered portion remains on an outer peripheral end of the wafer, and the remaining part of the chamfered portion falls off as a contaminant source in a post-step or causes chipping of individual device chips when dividing the wafer into the individual device chips.

In the above-described embodiment, the description is made regarding the example in which the above-described chamfered portion remover 30 is juxtaposed with the laser processing apparatus 20. However, the present invention is not limited to this example, and the chamfered portion remover 30 may be arranged independently of the laser processing apparatus 20. In such a modification, the above-described chamfered portion removing step may be performed, after performing the modified layer forming step in the laser processing apparatus 20, by loading the wafer, which has been unloaded from the laser processing apparatus 20, into the chamfered portion remover 30, and then holding the wafer on the holding unit 32.

The present invention is not limited to the details of the preferred embodiment. The scope of the invention is defined by the appended claims and all changes and modifications as fall within the equivalence of the scope of the claims are therefore to be embraced by the invention.

What is claimed is:

1. A processing method of a wafer having an effective area formed on a front surface thereof and a chamfered portion formed at an outer periphery thereof and surrounding the effective area, the processing method comprising:

a modified layer forming step of irradiating the wafer, from a back surface thereof, with a laser beam of a wavelength having transmissivity for the wafer with a focal point of the laser beam positioned inside a boundary portion between the effective area and the chamfered portion, whereby a modified layer is formed along the chamfered portion;

a chamfered portion removing step of, after performing the modified layer forming step, applying an external force to the outer periphery of the wafer to remove the chamfered portion; and a processing step of grinding the back surface of the wafer to process the wafer to a desired thickness, wherein the modified layer forming step includes a first step of irradiating the wafer with the laser beam with the focal point of the laser beam positioned inside the boundary portion between the effective area and the chamfered portion such that a first modified layer is formed relatively deep, with cracks formed extending to the front surface of the wafer, and a second step of irradiating the wafer with the laser beam with the focal point of the laser beam positioned inside the boundary portion between the effective area and the chamfered portion such that a second modified layer is formed relatively shallow, adjacent and on an outer or inner side of the first modified layer, with cracks formed not extending to the front surface of the wafer, and the chamfered portion is bent, from a side of the front surface toward a side of the back surface, with the first modified layer as a start point.

2. The processing method according to claim 1, wherein, in the chamfered portion removing step, the external force is applied to the outer periphery of the wafer by any one of high-pressure air, high-pressure water, a mixed fluid of high-pressure air and high-pressure water, or a picker.

3. The processing method according to claim 1, wherein the chamfered portion removing step is performed by an external force applied by action of grinding when the back surface of the wafer is ground in the processing step.

4. The processing method according to claim 1, wherein the wafer is a bonded wafer in which a first wafer and a second wafer are bonded together, and the modified layer forming step, the chamfered portion removing step, and the processing step are performed on the first wafer.

5. The processing method according to claim 1, wherein, in the second step, the second modified layer is formed at a position where the second modified layer is to be ground and removed in the processing step.

* * * * *